United States Patent
Sato et al.

(10) Patent No.: US 9,048,302 B2
(45) Date of Patent: Jun. 2, 2015

(54) FIELD EFFECT TRANSISTOR HAVING SEMICONDUCTOR OPERATING LAYER FORMED WITH AN INCLINED SIDE WALL

(75) Inventors: Yoshihiro Sato, Tokyo (JP); Hiroshi Kambayashi, Tokyo (JP); Yuki Niiyama, Tokyo (JP); Takehiko Nomura, Tokyo (JP); Seikoh Yoshida, Tokyo (JP); Masayuki Iwami, Tokyo (JP); Jiang Li, Tokyo (JP)

(73) Assignee: THE FURUKAWA ELECTRIC CO., LTD, Tokyo (JP)

( * ) Notice: Subject to any disclaimer, the term of this patent is extended or adjusted under 35 U.S.C. 154(b) by 141 days.

(21) Appl. No.: 12/318,779

(22) Filed: Jan. 8, 2009

(65) Prior Publication Data
US 2009/0194790 A1    Aug. 6, 2009

(30) Foreign Application Priority Data
Jan. 11, 2008  (JP) ................. 2008-004950

(51) Int. Cl.
| | |
|---|---|
| H01L 31/0328 | (2006.01) |
| H01L 31/0336 | (2006.01) |
| H01L 31/072 | (2012.01) |
| H01L 31/109 | (2006.01) |
| H01L 29/778 | (2006.01) |
| H01L 29/66 | (2006.01) |
| H01L 29/423 | (2006.01) |
| H01L 29/78 | (2006.01) |
| H01L 21/02 | (2006.01) |
| H01L 29/20 | (2006.01) |
| H01L 29/205 | (2006.01) |
| H01L 29/267 | (2006.01) |

(52) U.S. Cl.
CPC ...... *H01L 29/7783* (2013.01); *H01L 29/66462* (2013.01); *H01L 29/7789* (2013.01); *H01L 29/4232* (2013.01); *H01L 29/778* (2013.01); *H01L 21/0254* (2013.01); *H01L 21/02579* (2013.01); *H01L 21/0262* (2013.01); *H01L 29/2003* (2013.01); *H01L 29/205* (2013.01); *H01L 29/267* (2013.01); *H01L 29/4236* (2013.01); *H01L 29/66522* (2013.01); *H01L 29/7813* (2013.01)

(58) Field of Classification Search
CPC ............ H01L 29/66462; H01L 29/7813; H01L 29/7789; H01L 29/4232; H01L 29/4236; H01L 29/778
USPC ............... 257/192, 330, 496, E29.253
See application file for complete search history.

(56) References Cited

U.S. PATENT DOCUMENTS

| | | | |
|---|---|---|---|
| 4,568,958 A | * | 2/1986 | Baliga .................... 257/332 |
| 4,873,558 A | * | 10/1989 | Antreasyan et al. ......... 257/289 |

(Continued)

FOREIGN PATENT DOCUMENTS

| | | |
|---|---|---|
| WO | WO-03-071607 | 8/2003 |

*Primary Examiner* — Howard Weiss
(74) *Attorney, Agent, or Firm* — Lowe Hauptman & Ham, LLP

(57) ABSTRACT

A field effect transistor has an MOS structure and is formed of a nitride based compound semiconductor. The field effect transistor includes a substrate; a semiconductor operating layer having a recess and formed on the substrate; an insulating layer formed on the semiconductor operating layer including the recess; a gate electrode formed on the insulating layer at the recess; and a source electrode and a drain electrode formed on the semiconductor operating layer with the recess in between and electrically connected to the semiconductor operating layer. The recess includes a side wall inclined relative to the semiconductor operating layer.

20 Claims, 15 Drawing Sheets

(56) References Cited

U.S. PATENT DOCUMENTS

| | | | |
|---|---|---|---|
| 5,473,176 A * | 12/1995 | Kakumoto | 257/192 |
| 5,506,421 A * | 4/1996 | Palmour | 257/77 |
| 7,038,253 B2 * | 5/2006 | Yoshida et al. | 257/192 |
| 7,592,647 B2 * | 9/2009 | Nakata et al. | 257/194 |
| 2005/0023555 A1 | 2/2005 | Yoshida et al. | |

* cited by examiner

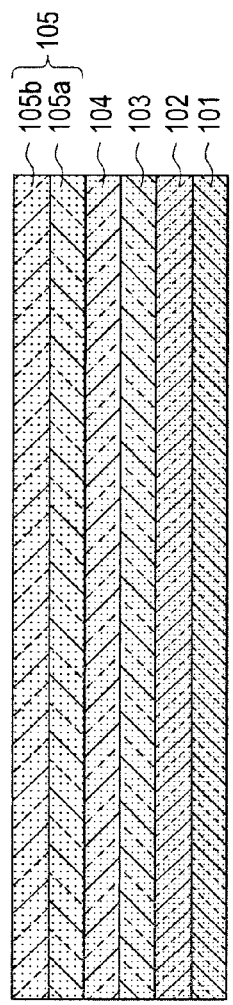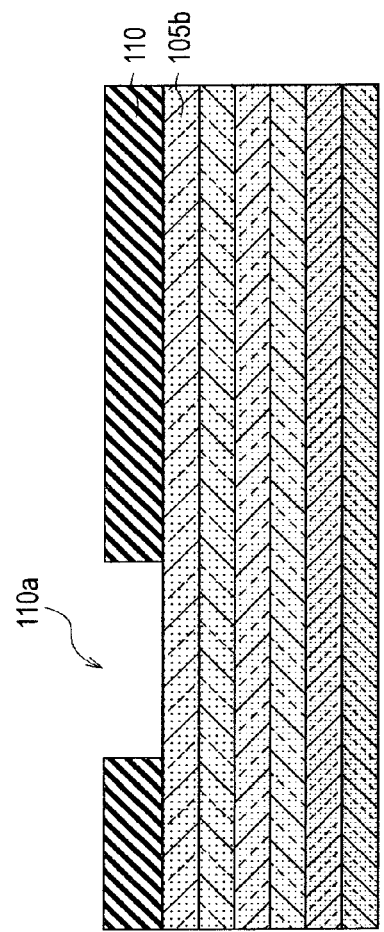

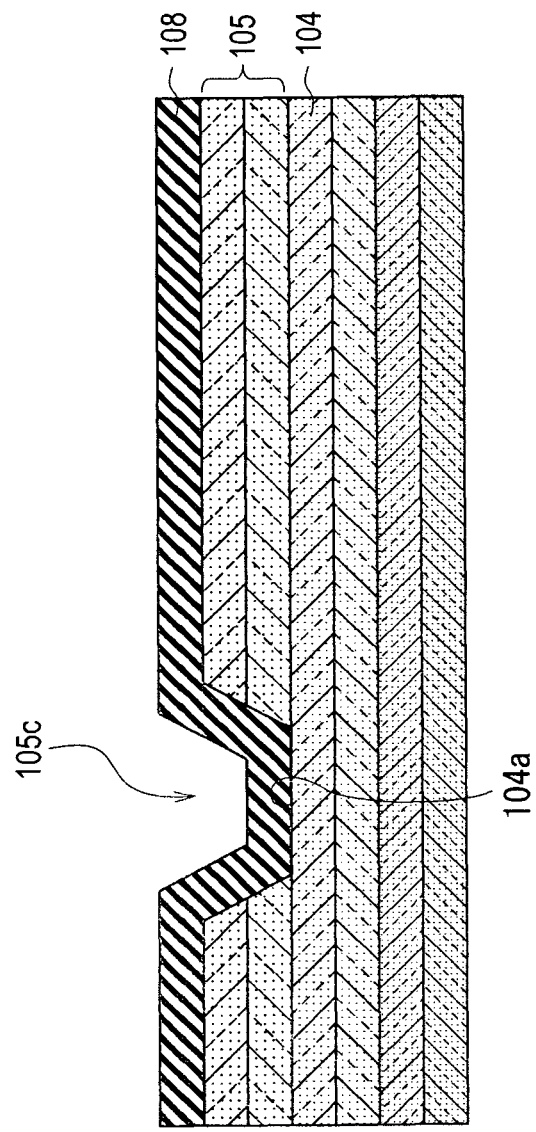

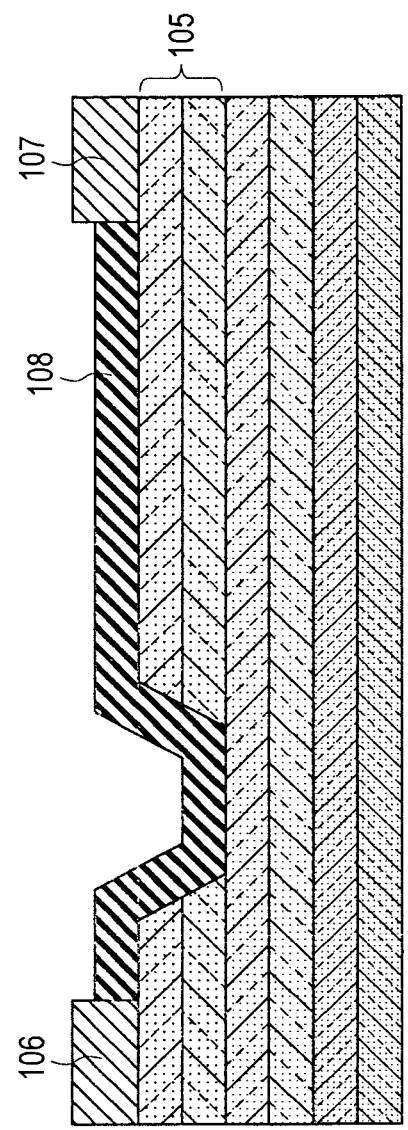

FIG.3

| | Material of Mask | Angle (degree) | On resistance (mΩ cm²) | Breakdown Voltage (V) |
|---|---|---|---|---|
| Example 1-1 | a-Si | 65 | 12 | 650 |
| Example 1-2 | Photo resist resin | 43 | 17 | 700 |
| Comparative Example 1 | SiO₂ | 90 | 25 | 300 |

FIG. 7

| | Material of Mask | Angle (degree) | On resistance (mΩ cm$^2$) | Breakdown Voltage (V) |
|---|---|---|---|---|
| Example 2-1 | a-Si | 65 | 12 | 638 |
| Example 2-2 | Photo resist resin | 43 | 18 | 694 |
| Comparative Example 2 | SiO$_2$ | 90 | 24 | 295 |

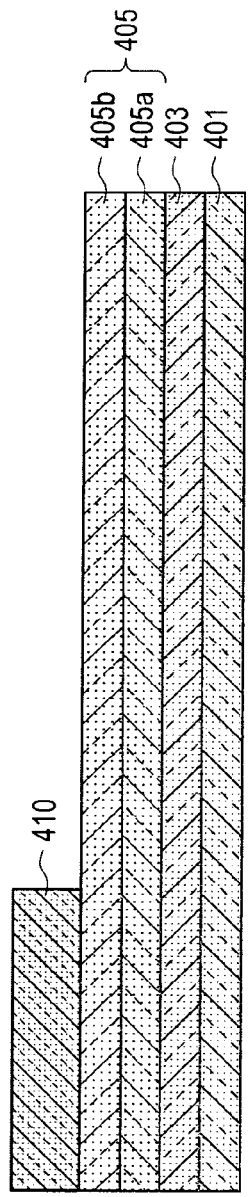
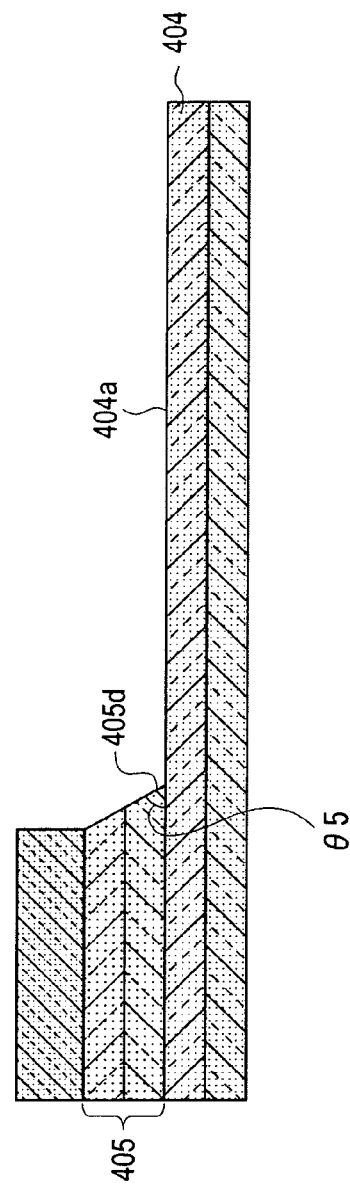
FIG. 9A
FIG. 9A

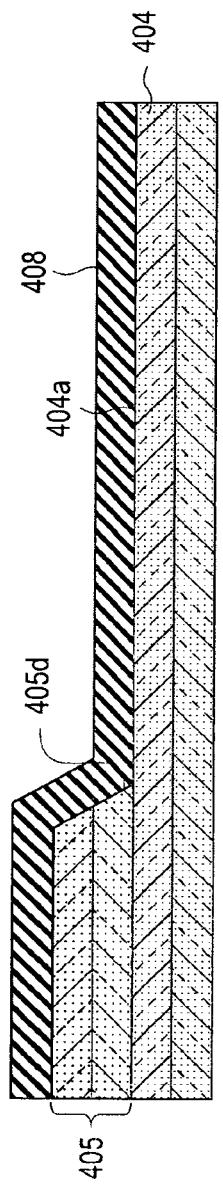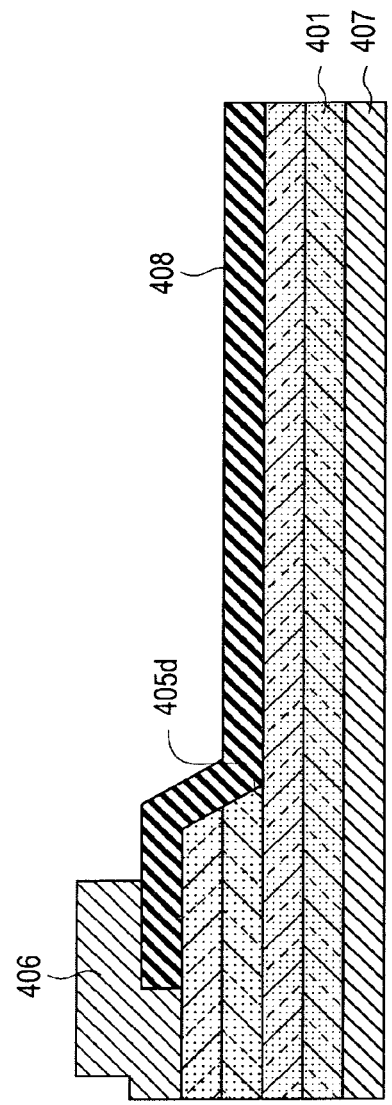

FIG.10

| | Material of Mask | Angle (degree) | On resistance (mΩ cm$^2$) | Breakdown Voltage (V) |
|---|---|---|---|---|
| Example 3-1 | a-Si | 65 | 5 | 530 |
| Example 3-2 | Photo resist resin | 43 | 9 | 550 |
| Comparative Example 3 | SiO$_2$ | 90 | 16 | 200 |

FIELD EFFECT TRANSISTOR HAVING SEMICONDUCTOR OPERATING LAYER FORMED WITH AN INCLINED SIDE WALL

CROSS REFERENCE TO RELATED APPLICATIONS

This application claims priority from a Japanese patent application No. 2008-004950 filed on Jan. 11, 2008, the entire content of which is incorporated herein by reference.

BACKGROUND OF THE INVENTION

1. Field of the Invention

The present invention relates to a field effect transistor comprised of a nitride based compound to be used for a device for power electronics and a device of high frequency amplification, and to a process for producing the same.

2. Description of the Related Art

A wide band gap semiconductor representative of a III-V group nitride based compound is extremely attractive as a material for a semiconductor device for a high temperature, a large power, or for a high frequency, because of having a breakdown voltage as high, a electronic transport property as satisfactory, and a thermal conductivity as satisfactory. Moreover, regarding a field effect transistor (an FET) having an AlGaN/GaN hetero structure for example, a two dimensional electron gas is generated in an interface due to a piezoelectric effect. The two dimensional electron gas draws attention because of high electron mobility and carrier density. Further, a hetero-junction FET (an HFET) using the AlGaN/GaN hetero structure has a low resistance and a fast switching speed, so that it is possible to perform an operation at a high temperature environment. The features are suitable for an application of a power switching.

The ordinary AlGaN/GaN HFET is a device of a normally on type, in which an electric current flows in a case where a bias is not applied to a gate, and then an electric current is cut off by applying a negative electric potential to the gate therein. In the application of the power switching, for securing safety, it is preferable to use the device of the normally off type, in which an electric current does not flow in the case where a bias is not applied to a gate, and then an electric current flows by applying a positive electric potential to the gate.

In order to produce the device of normally off type, it is necessary to adopt an MOS structure. For example, International Patent Application Publication No. 2003/071607 has disclosed a field effect transistor having the MOS structure (an MOSFET), wherein a carrier supplying layer comprised of AlGaN or the like is etched off at a gate, and an insulating layer is formed on an etched surface of a carrier drifting layer.

In the field effect transistor disclosed in the patent document, a side wall of the carrier supplying layer thus etched off is formed approximately vertical to the etched surface of the carrier drifting layer. As a result, an electric field is converged at a corner with a right angle formed with the side wall of the carrier supplying layer and the etched surface of the carrier drifting layer between the gate and a drain, thereby decreasing a breakdown voltage.

SUMMARY OF THE INVENTION

The present invention is presented with regard to the above mentioned conventional problems, and an object is to provide a field effect transistor having a high breakdown voltage, and to provide a process for producing the field effect transistor.

For solving the problems and attaining the objects, according to the present invention, a field effect transistor is formed of a nitride based compound semiconductor. The field effect transistor includes a substrate; a semiconductor operating layer having a recess and formed on the substrate; an insulating layer formed on the semiconductor operating layer including the recess; a gate electrode formed on the insulating layer at the recess; and a source electrode and a drain electrode formed on the semiconductor operating layer with the recess in between and electrically connected to the semiconductor operating layer. The recess includes a side wall inclined relative to the semiconductor operating layer.

According to the present invention, a process for producing a field effect transistor formed of a nitride based compound semiconductor includes the steps of: forming a semiconductor operating layer onto a substrate; forming a recess having a side wall inclined relative to the semiconductor operating layer on the semiconductor operating layer; forming a source electrode and a drain electrode on the semiconductor operating layer with the recess in between for electrically connecting to the semiconductor operating layer; forming an insulating layer on the semiconductor operating layer having the recess; and forming a gate electrode on the insulating layer at the recess.

In the present invention, it is possible to alleviate a localized convergence of an electric field between the gate and the drain, thereby obtaining the field effect transistor having a high breakdown voltage.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 2A to 2F are views showing one example of a process for producing the MOSFET shown in FIG. 1;

FIG. 3 is a chart showing an angle at a side wall, an on-resistance and a breakdown voltage of MOSFETs according to Example 1-1, 1-2 and Comparative example 1, respectively;

FIG. 7 is a chart showing an angle at a side wall, an on-resistance and a breakdown voltage of MOSFETs according to Example 2-1, 2-2 and Comparative example 2, respectively;

FIGS. 9A to 9D are views showing one example of a process for producing the MOSFET shown in FIG. 8; and FIG. 10 is a chart showing an angle at a side wall, an on-resistance and a breakdown voltage regarding individual MOSFETs according to Example 3-1, 3-2 and Comparative example 3, respectively.

DETAILED DESCRIPTION OF THE PREFERRED EMBODIMENTS

Embodiments of a field effect transistor and of a process for producing the field effect transistor according to the present invention will be described in detail below with reference to the drawings. The present invention is not limited to the embodiments.

Figure 1:
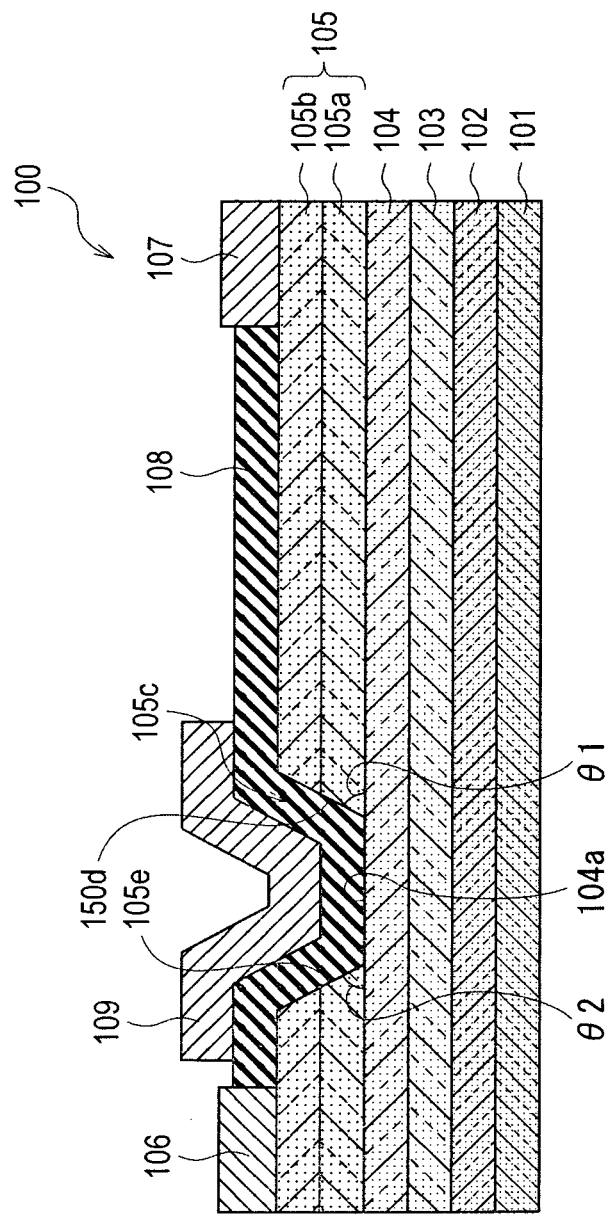
FIG. 1 is a cross sectional view showing an MOSFET according to a first embodiment.

FIG. 1 is a cross sectional view showing exemplary an MOSFET according to a first embodiment of the present invention. In the MOSFET 100, there are formed an AlN layer 102, a buffer layer 103 formed by laminating alternately a GaN layer and an AlN layer, and a lower semiconductor layer 104 comprised of p-GaN on a substrate 101 comprised of sapphire, SiC, Si, or the like. A semiconductor operating layer 105 is formed on the lower semiconductor layer 104. Regarding the semiconductor operating layer 105, a carrier drifting layer 105$a$, which is comprised of undoped GaN, and a carrier supplying layer 105$b$, which is comprised of n-AlGaN and has a band gap energy different from, e.g., greater than, that of the carrier drifting layer 105$a$, are laminated one by one. A recess 105$c$ is formed by removing a part of the carrier drifting layer 105$a$ and of the carrier supplying layer 105$b$ to a depth reaching the lower semiconductor layer 104. On the semiconductor operating layer 105, a source electrode 106 and a drain electrode 107 are formed and sandwich the recess 105$c$. A gate insulating layer 108, which is comprised of $SiO_2$ or the like, is formed over a top surface of the semiconductor operating layer 105 and a top surface 104$a$ of the lower semiconductor layer 104 at an inside of the recess 105$c$. At the recess 105$c$, a gate electrode 109 is formed on the gate insulating layer 108.

The MOSFET 100 is operated as a normally off type. Due to a two dimensional electron gas generated at an interface of the carrier drifting layer 105$a$ to the carrier supplying layer 105$b$, it becomes able to obtain a low on-resistance and a faster switching operation.

In the MOSFET 100, a side wall 105$d$ at a side of the drain electrode 107 of the recess 105$c$ extends, inclining at an angle of θ1, from the top surface 104$a$ of the lower semiconductor layer 104. Accordingly, it is possible to alleviate a localized convergence of an electric field between the gate and the drain, as opposed to the conventional configuration where a side wall extends vertically from a surface of a lower semiconductor layer. As a result, it becomes able to obtain the MOSFET 100 having a high breakdown voltage.

In the MOSFET 100, the side wall 105$d$ is inclined, so that a thickness of the carrier supplying layer 105$b$ decreases gradually from a side of the drain electrode 107. Therefore, a density of the two dimensional electron gas to be generated at the carrier drifting layer 105$a$ decreases gradually corresponding to the decrease in the thickness of the carrier supplying layer 105$b$. As a result, a reduced surface field (RESURF) region is formed directly under the gate electrode 109 for alleviating the local convergence of the electric field, thereby further improving the breakdown voltage.

When the angle θ1 is less than 90 degrees, it is possible to relax the localized convergence of the electric field. It is preferable the angle θ1 is smaller than 75 degrees, and more preferably is smaller than 65 degrees, because it is possible to relax the localized convergence sufficiently. When the angle of θ1 is greater than 30 degrees, the on-resistance reduces, and a distance between the source and the drain becomes not too long, thereby making it desirable to reduce a size for a device and a producing cost.

In the MOSFET 100, a side wall 105$e$ at a side of the source electrode 106 of the recess 105$c$ extends, inclining at an angle θ2, from the top surface 104$a$ of the lower semiconductor layer 104. The angle θ2 is similar to the angle θ1. However, regarding the side wall 105$e$, the angle θ2 may be different from the angle θ1, and the side wall 105$e$ may extend vertically from the top surface 104$a$.

Next, a process for producing the MOSFET 100 will be described in detail below. FIGS. 2A to 2F are explanatory views explaining one example of the process for producing the MOSFET 100. In the following description, a metalorganic chemical vapor deposition (MOCVD) method is used, and the invention is not limited thereto.

First, as shown in FIG. 2A, the substrate 101 comprised of Si and having an (111) plane as a principal top surface plane is set to an MOCVD device. Next, using a hydrogen gas with a concentration of 100% as a carrier gas, trimethylgallium (TMGa), trimethylaluminum (TMAl) and $NH_3$ are introduced at a flow rate of 58 μmol/min, 100 μmol/min and 12 l/min, respectively. Then, the lower semiconductor layer 104 comprised of the AlN layer 102, the buffer layer 103 and the p-GaN is epitaxially grown on the substrate 101 one by one to be at a growth temperature of 1,050° C. As a doping source of p-type corresponding to the lower semiconductor layer 104, biscyclopentadienylmagnesium ($Cp_2Mg$) is used. A flow rate of $Cp_2Mg$ is controlled such that a concentration of Mg becomes approximately $1 \times 10^{17}$ $cm^{-3}$. Next, TMGa and $NH_3$ are introduced at a flow rate of 19 μmol/min and 12 l/min, respectively. The carrier drifting layer 105$a$ comprised of an undoped GaN is epitaxially grown on the lower semiconductor layer 104 at a growth temperature of 1,050° C. Then, TMAl, TMGa and $NH_3$ are introduced at a flow rate of as 125 μmol/min, 19 μmol/min, and 12 l/min, respectively. Then, the carrier supplying layer 105$b$ comprised of n-AlGaN having an Al composition of 25% is epitaxially grown on the carrier drifting layer 105$a$, thereby forming the semiconductor operating layer 105. $SiH_4$ is used as a doping source of n type for the carrier supplying layer 105$b$.

In the above description, the buffer layer 103 is formed of approximately eight layers of a GaN/AlN composite lamination having a thickness of 200/20 nm. The thicknesses of the AlN layer 102, the lower semiconductor layer 104, the carrier drifting layer 105$a$, and the carrier supplying layer 105$b$ are 100 nm, 500 nm, 100 nm, and 20 nm, respectively.

Next, as shown in FIG. 2B, using a plasma chemical vapor deposition (PCVD) method, a mask layer 110 comprised of amorphous silicon (a-Si) is formed on the carrier supplying layer 105$b$ to have a thickness of 500 nm. A patterning is performed using photolithography and a $CF_4$ gas to form an open part 110$a$.

Next, the recess 105$c$ is formed by etching and removing a part of the carrier drifting layer 105$a$ and the carrier supplying layer 105$b$ with the mask layer 110 as a mask using a $Cl_2$ gas as an etching gas. The $Cl_2$ gas etches not only the surface of the carrier supplying layer 105$b$ exposed inside the open part 110$a$, but also a side wall 110$b$ of the open part 110$a$, so that the side wall 110$b$ recedes little by little.

Figure 2C:
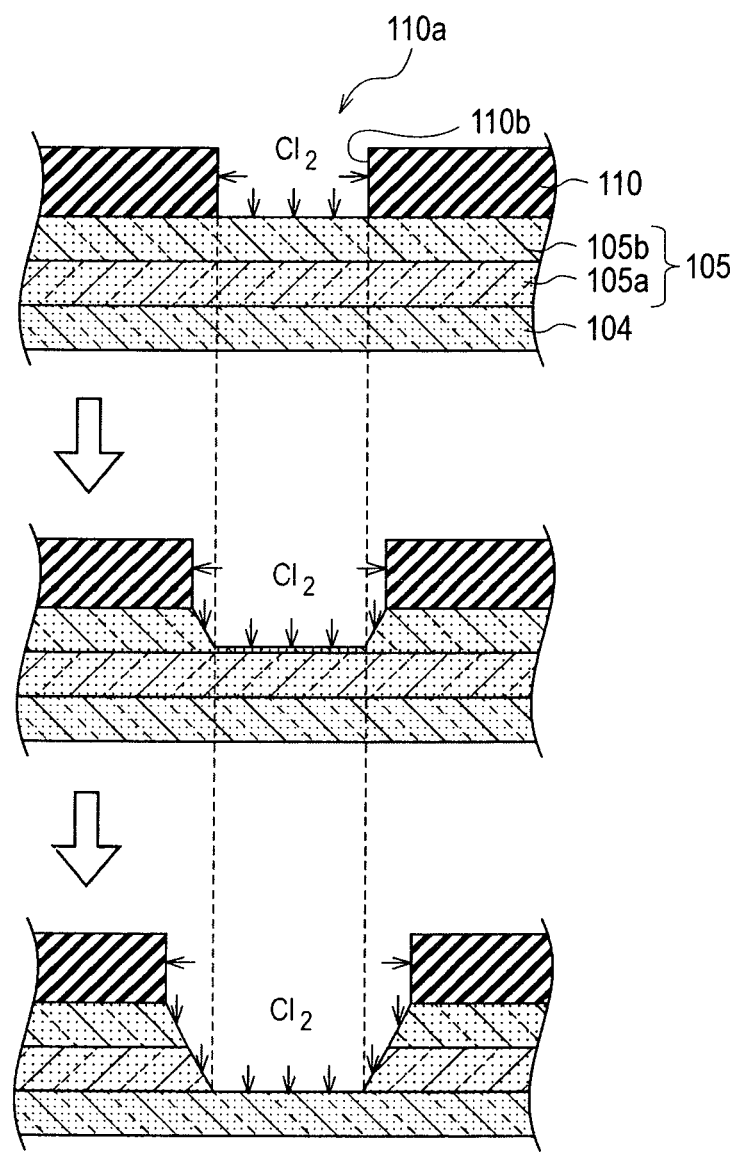
Figure 2D:
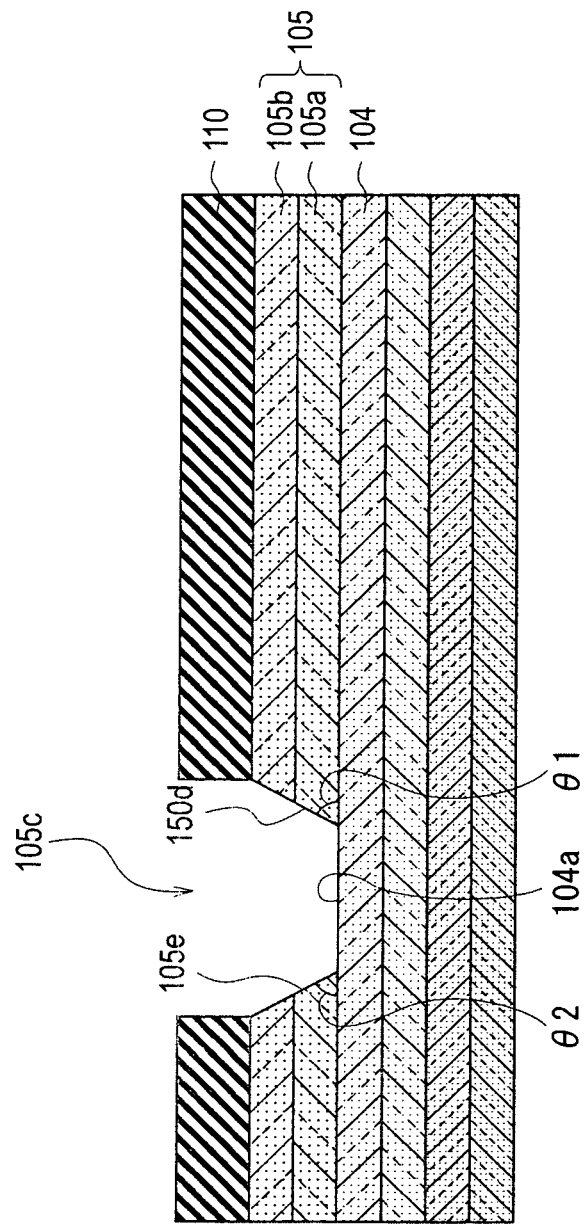

As the side wall 110$b$ is receding, a fresh surface of the carrier supplying layer 105$b$ is exposed step by step. The fresh surface thus exposed of the carrier supplying layer 105$b$ has a large etching depth at a part exposed at an earlier stage due to a longer period of time, and has a small etching depth at a part exposed at a later stage due to a shorter period of time. The side wall 110$b$ recedes continuously, so that the etching depth of the carrier supplying layer 105$b$ and of the carrier drifting layer 105$a$ change continuously as well. Thus, an etched surface formed by etching the fresh surface thus exposed is inclined. On the contrary, the surface of the carrier supplying layer 105$b$ exposed from the beginning at the open part 110$a$ is etched to have an approximately flat depth. When the lower semiconductor layer 104 is etched to a depth reaching approximately 120 nm, the recess 105$c$ is formed as shown in FIG. 2D. The recess 105$c$ has a shape having the side walls 105$d$ and 105$e$ extending from the top surface 104$a$, inclining at the angle θ1 and the angle θ2, respectively, and the flat top surface 104a of the lower semiconductor layer 104 as a bottom face.

The angle θ1 and the angle θ2 of the side wall 105d and the side wall 105e relative to the top surface 104a are determined by a ratio of etching rates of the semiconductor operating layer 105 and for the mask layer 110. As described above, when the semiconductor operating layer 105 is formed of the GaN base material, the etching gas is the $Cl_2$ gas, and the mask layer 110 is comprised of a-Si, the angle θ1 and the angle θ2 are approximately 65 degrees. When the mask layer 110 is formed of a novolac based resist resin of positive type, the angle θ1 and the angle θ2 are approximately 43 degrees. When the etching rate of the mask layer is defined as an a (nm/min) and the etching rate of the semiconductor operating layer is defined as a b (nm/min), an inclination angle θ becomes approximately $\theta=\tan^{-1}(b/a)$.

The mask layer 110 is etched not only from the side wall 110b at the open part 110a, but also from the surface thereof. Therefore, the etching is performed until the lower semiconductor layer 104 is exposed, the mask layer 110 needs to have a sufficient thickness so as not to expose the carrier supplying layer 105b at a part except the open part 110a.

Next, as shown in FIG. 2E, the mask layer 110 is removed, and then with the PCVD method using $SiH_4$ and $N_2O$ as raw material gases, the gate insulating layer 108 comprised of $SiO_2$ is formed over the top surface of the semiconductor operating layer 105 and the top surface 104a of the lower semiconductor layer 104 inside the recess 105c to have a thickness of 60 nm. The side wall 105d and the 105e are inclined, so that the gate insulating layer 108 has a uniform thickness comparing to a case where the side wall extends vertically.

Next, as shown in FIG. 2F, a part of the gate insulating layer 108 is removed using hydrofluoric acid, and then the source electrode 106 and the drain electrode 107 are formed on the semiconductor operating layer 105 using a lift-off technology. The source electrode 106 and the drain electrode 107 have a Ti/Al structure with a thickness of 25/300 nm. The metal layer may be formed using a spattering method, a vacuum evaporation method, or the like. After the source electrode 106 and the drain electrode 107 are formed, a process of an annealing is performed for ten minutes at a temperature of 600° C.

Next, using the lift-off technology, the gate electrode 109 with a Ti/Al/Ti structure is formed at the recess 105c, thereby completing the MOSFET 100 shown in FIG. 1.

As described above, according to the first embodiment, the MOSFET 100 has the high breakdown voltage.

Example 1

Comparative Example 1

As Example 1-1, 1-2 and Comparative example 1 according to the present invention, each of MOSFETs is produced, that individually has a structure as similar to that of the MOSFET 100 as shown in FIG. 1. Here, the MOSFET regarding Example 1-1 is produced by following the above described process. Moreover, the MOSFET regarding Example 1-2 is produced almost by following the above described process, however, the different point is that the mask layer is formed, which is comprised of the novolac based resist resin of the positive type (the product type of TSM8900 produced by Tokyo Oka Kogyo Co.), and then used for performing the process of the patterning. Further, the MOSFET regarding Comparative example 1 is produced almost by following the above described process, and the different point is that the mask layer is formed with having a thickness as 300 nm, which is comprised of the $SiO_2$ by using the PCVD method, and then the process of the patterning is performed by using the photolithography and with using a $CHF_3$ gas. Still further, regarding each of the MOSFETs according to Example 1-1, 1-2 and Comparative example 1, a distance between the gate and the drain is designed to be as 24 μm, as it becomes to be sufficiently longer comparing to the thickness from the substrate for each of the MOSFETs to each of the carrier supplying layers thereon respectively. Still further, an on-resistance and a breakdown voltage are measured for each of the MOSFETs according to Example 1-1, 1-2 and Comparative example 1 respectively. Furthermore, each of angles at which each of the side walls is extending at the side of the drain electrode in the semiconductor operating layer at the recess thereof, respectively, is measured by observing a cross section regarding each of the MOSFETs, respectively.

FIG. 3 is a chart showing an angle at a side wall, an on-resistance and a breakdown voltage for each of the MOSFETs according to Example 1-1, 1-2 and Comparative example 1 respectively. As shown in FIG. 3, in the case of Comparative example 1, the angle at the side wall is not inclined as it is 90 degrees, because almost all of $SiO_2$ as the mask layer is not etched by the $Cl_2$ gas. Also in Comparative example 1, the on-resistance is as high as 25 mΩ $cm^2$, and the breakdown voltage is as low as 300 V. On the contrary, in the case of Example 1-1 and 1-2, the angles at the side walls are 65 degrees and 43 degrees, respectively. The on-resistances in Example 1-1 and 1-2 are 12 mΩ $cm^2$ and 17 mΩ $cm^2$, respectively. The breakdown voltages in Example 1-1 and 1-2 are 650 V and 700 V, respectively, that are approximately similar to the breakdown voltage of 700 V, which is estimated by the laminated structure and the thickness, that are from the substrate via the buffer layer to the carrier supplying layer thereon. That is to say, it becomes able to confirm that there becomes no localized convergence of the electric field occurring at between the gate and the drain regarding the MOSFETs according to Example 1-1 and 1-2.

Second Embodiment

Figure 4:
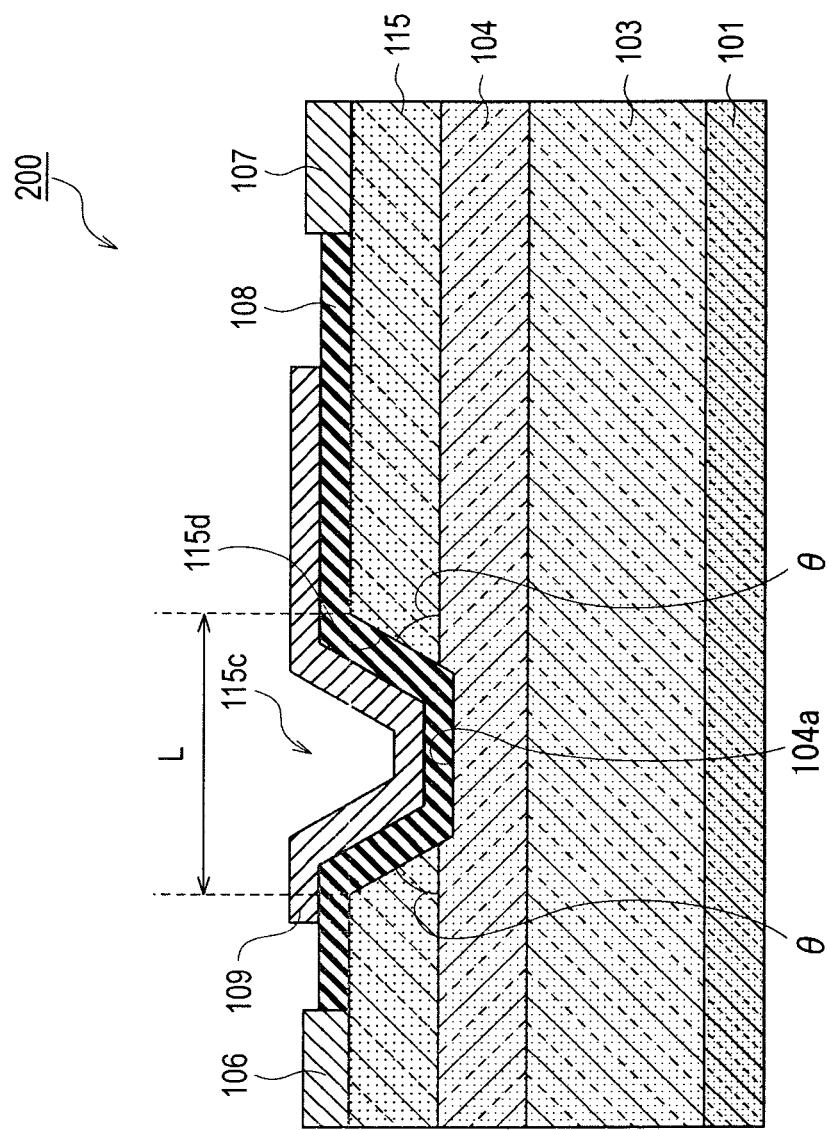
FIG. 4 is a cross sectional view showing an MOSFET according to a second embodiment.

Next, an angle at a side wall to be preferred for the FET according to the present invention will be described in detail below. FIG. 4 is an exemplary cross sectional view showing an MOSFET regarding the second embodiment according to the present invention. As shown in FIG. 4, regarding such an MOSFET 200, there are formed a buffer layer 103 by forming with laminating alternately a GaN layer and an AlN layer, a lower semiconductor layer 104 comprised of p-GaN, and a drift layer 115 comprised of an n-GaN combining with a contact layer, on a substrate 101 comprised of sapphire, SiC, Si, or the like. Moreover, a recess 115c is formed at the drift layer 115 by removing a surface thereof to a depth as reaching the lower semiconductor layer 104. Further, a gate insulating layer 108, which is comprised of $SiO_2$ or the like, is formed over a top surface of the drift layer 115 and a top surface of the lower semiconductor layer 104 at an inside of the recess 115c. A gate electrode 109 is formed on the gate insulating layer 108 at the recess 115c.

Furthermore, regarding the MOSFET 200, a side wall 115d at the recess 115 extends at an inclination angle θ from a top surface 104a of the lower semiconductor layer 104.

Figure 5:
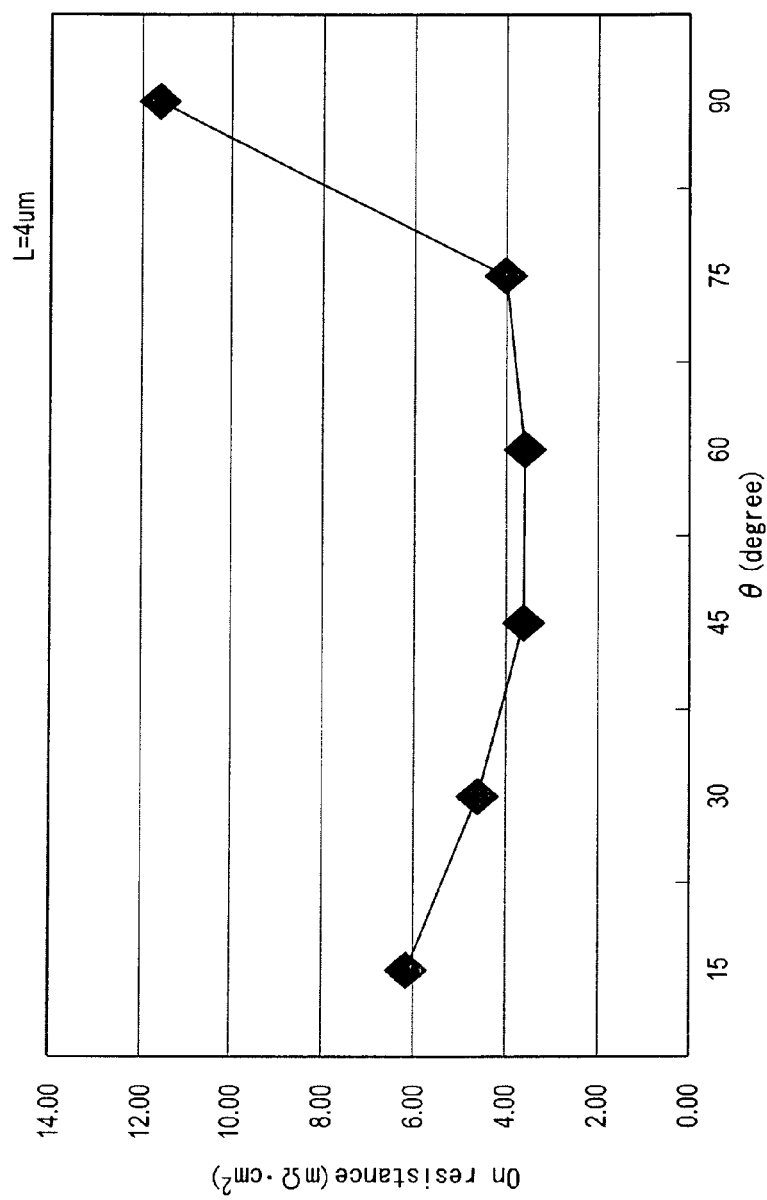
FIG. 5 is a graph showing a relationship between an angle at a side wall and an on-resistance of an MOSFET shown in FIG. 4.

FIG. 5 is a graph showing a relationship between the angle θ and an on-resistance at the side wall 115d of the recess 115 according to the MOSFET 200 as shown in FIG. 4.

As shown in FIG. 4, in a case where the angle at the side wall 115d is 90 degrees, the on-resistance is high, and also it is not able to obtain a sufficient value regarding the maximum current value as 0.21 A/mm. On the contrary, in a case where the angle is not wider than 75 degrees, the on-resistance is decreased to approximately one third of the on-resistance when the angle is 90 degrees, and also the maximum current value is increased to 0.37 A/mm, which is approximately 1.8 times of the maximum current value when the angle is 90 degrees.

On the contrary, in a case where the becomes narrower than 30 degrees, an area of the side wall 115d at the recess 115 becomes relatively large, and then it causes an increase in an area of a device.

According to the above description, regarding the field effect transistor according to the present invention, it is desirable for the angle at the side wall of the recess to be not narrower than 30 degrees but not wider than 75 degrees.

Third Embodiment

Next, an MOSFET regarding the third embodiment according to the present invention will be described in detail below. The MOSFET according to the third embodiment has a structure as similar to that of the MOSFET 100 as shown in FIG. 1. However, there is a difference in that a semiconductor operating layer comprises a contact region directly under a source electrode and a drain electrode.

Figure 6:
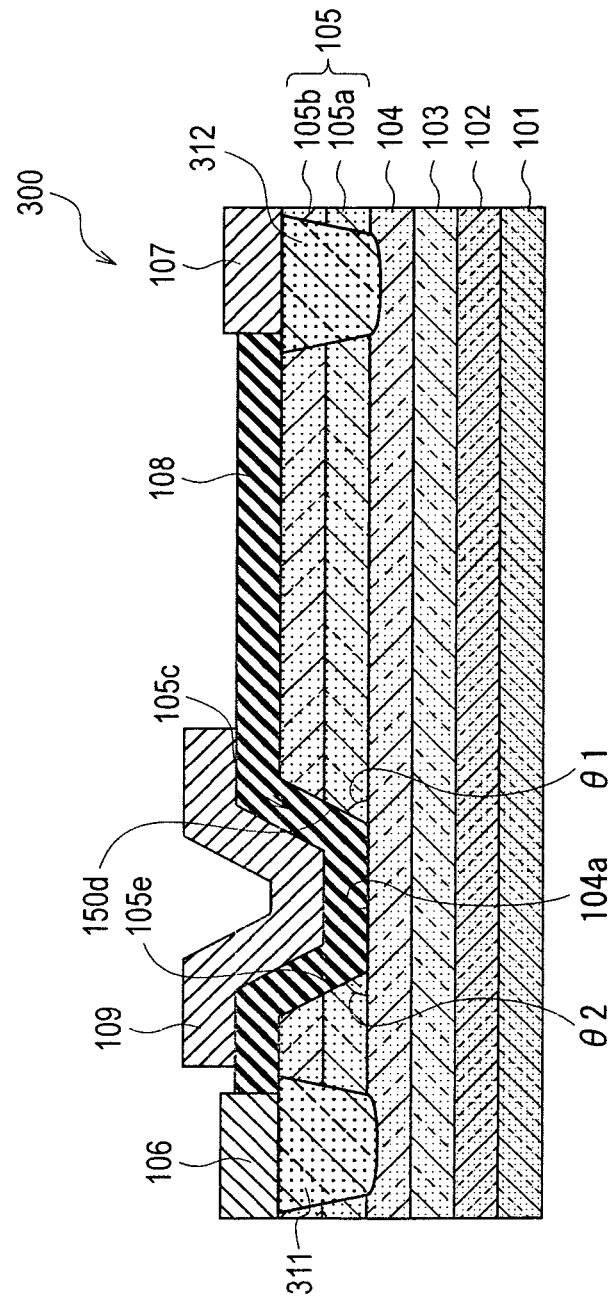
FIG. 6 is a cross sectional view showing an MOSFET according to a third embodiment.

FIG. 6 is a cross sectional view showing exemplary an MOSFET regarding the third embodiment according to the present invention. Such a MOSFET 300 comprises contact regions 311 and 312 having an electrical conductivity type of an $n^+$ type respectively, at directly under a source electrode 106 and a drain electrode 107 respectively, in addition to the configuration as similar to that of the MOSFET 100. And a contact resistivity for the source electrode 106 and for the drain electrode 107 is designed to be as lower. Moreover, the contact region 311 and the 312 are formed from a semiconductor operating layer 105 to a depth as reaching a lower semiconductor layer 104, however, it is possible to set the formed depth properly.

Further, it is possible to form contact regions 311 and 312 by providing an open part at a predetermined part thereof respectively, and then by introducing Si, Ge, Sn, or the like, as an impurity of n type, by using such as an ion implantation method, a diffusion method, or the like. Furthermore, it may be also able to remove a region beforehand for forming the contact regions 311 and 312, and then to form a layer having a desired impurity concentration by using a process for a selective re-growth thereof as well.

As described above, the MOSFET 300 according to the third embodiment has the high breakdown voltage and the contract resistivity for the source electrode and for the drain electrode as lower.

Example 2

Comparative Example 2

As Example 2-1, 2-2 and Comparative example 2 according to the present invention, each of MOSFETs is produced with forming the contact regions 311 and 312 by using the ion implantation method, that individually has a structure as similar to that of the MOSFET 300 as shown in FIG. 6. Here, regarding the MOSFET according to Example 2-1, a patterning for a recess is performed with using a mask layer comprised of a-Si as similar to that according to Example 1-1.

Moreover, regarding the MOSFET according to Example 2-2, a mask layer is formed, which is comprised of a resist resin of the positive type as similar to that according to Example 1-2, and then a patterning for a recess is performed therewith. Further, regarding the MOSFET according to Comparative example 2, a mask layer is formed, which is comprised of $SiO_2$ as similar to that according to Comparative example 1, and then a patterning for a recess is performed therewith. Still further, regarding each of the MOSFETs according to Example 2-1, 2-2 and Comparative example 2, a distance between the gate and the drain is designed to be as 24 μm, as it becomes to be sufficiently longer comparing to the thickness from the substrate for each of the MOSFETs to the carrier supplying layer thereon respectively. Still further, an on-resistance and a breakdown voltage are measured for each of the MOSFETs according to Example 2-1, 2-2 and Comparative example 2 respectively. Furthermore, each of angles at which each of the side walls is extending at the side of the drain electrode in the semiconductor operating layer at the recess is measured, respectively.

FIG. 7 is a chart showing an angle at a side wall, an on-resistance and a breakdown voltage for each of the MOSFETs according to Example 2-1, 2-2 and Comparative example 2 respectively. As shown in FIG. 7, in the case of Comparative example 2, the on-resistance is as high as 24 mΩ $cm^2$, and the breakdown voltage is as low as 295 V. On the contrary, in the case of Example 2-1 and 2-2, each of the on-resistances is lower at 12 mΩ $cm^2$ and 18 mΩ $cm^2$, respectively. Moreover, each of the breakdown voltages is higher at 638 V and 694 V, respectively. That is to say, it becomes able to confirm that there becomes no localized convergence of the electric field occurring at between the gate and the drain regarding the MOSFETs according to Example 2-1 and 2-2.

Fourth Embodiment

Next, an MOSFET regarding the fourth embodiment according to the present invention will be described in detail below. The MOSFET according to the fourth embodiment is a MOSFET having a vertical structure.

Figure 8:
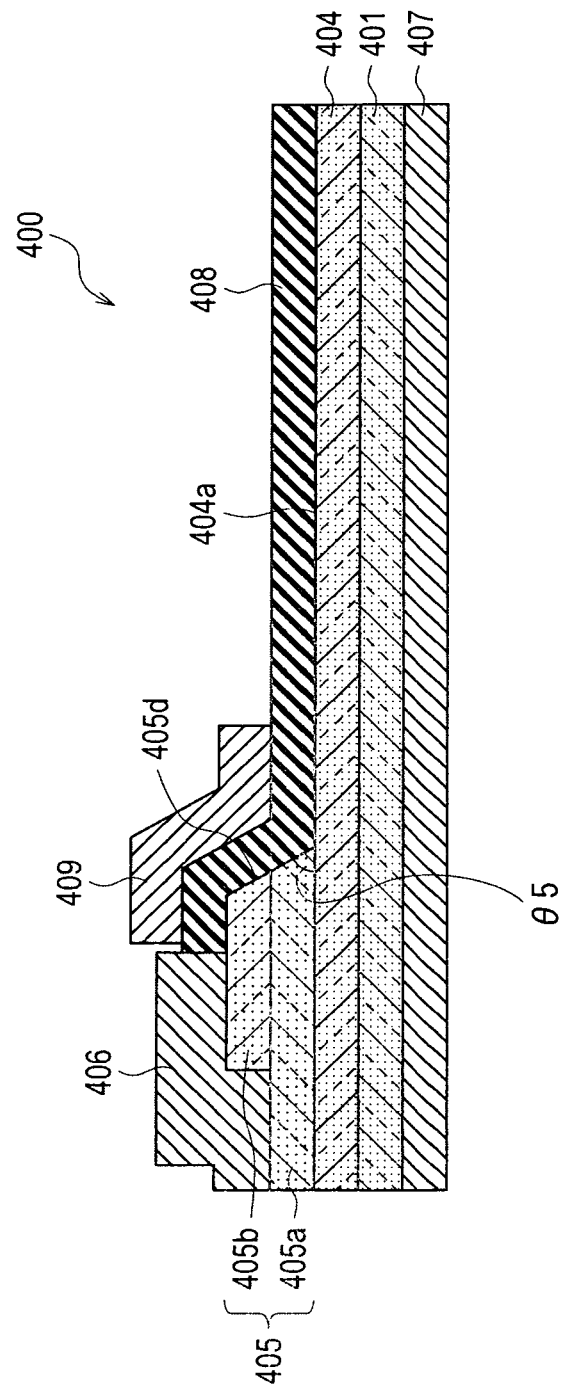
FIG. 8 is a cross sectional view showing an MOSFET according to a fourth embodiment.

FIG. 8 is a cross sectional view showing exemplary an MOSFET regarding the fourth embodiment according to the present invention. Regarding such an MOSFET 400, there is formed a drift layer 404 as a lower semiconductor layer, which is comprised of $n^-$-GaN and has a carrier density as lower, on a substrate 401 comprised of an n-GaN. Moreover, a semiconductor operating layer 405 is formed at a region for a part of the drift layer 404. Further, regarding the semiconductor operating layer 405, a carrier drifting layer 405a comprised of a p-GaN and a carrier supplying layer 405b comprised of an $n^+$-GaN are laminated one by one. Still further, regarding the semiconductor operating layer 405, a side wall 405d is formed for inclining from a surface 404a of the drift layer 404. Still further, on the semiconductor operating layer 405, a source electrode 406 is formed for connecting to both of the carrier drifting layer 405a and the carrier supplying layer 405b. And then a contact resistivity for the source electrode 406 becomes to be lower, because the carrier supplying layer 405b carries out a function as a contact layer due to the electrical conductivity type thereof as the $n^+$ type. Still further, a drain electrode 407 is formed at a rear surface of the substrate 401. Still further, a gate insulating layer 408, which is comprised of $SiO_2$ or the like, is formed over a surface of the semiconductor operating layer 405, the inclined side wall 405d and the surface 404a of the drift layer 404. Furthermore, a gate electrode 409 is formed on the gate insulating layer 408 for surrounding the side wall 405d.

Regarding the MOSFET 400, a channel is formed along the side wall 405d regarding the carrier drifting layer 405a. And then because the side wall 405d extends at an inclination angle θ5 from the surface 404a of the drift layer 404, a localized convergence of an electric field becomes to be relaxed at between the gate and the drain, that is different from a case where a side wall extends vertically from a surface of a drift layer. As a result, it becomes able to realize the MOSFET having the property of the breakdown voltage as higher.

A process for producing the MOSFET 400 will be described next. FIGS. 9A to 9D are explanatory views explaining one example of a process for producing the MOSFET 400.

First, the substrate 401 comprised of n-GaN is set to an MOCVD device. Next, with using the hydrogen gas of the concentration as 100% for a carrier gas, TMGa and $NH_3$ are introduced thereinto with a rate of flow as 58 μmol/min and 12 l/min, respectively. And then the drift layer 404, the carrier drifting layer 405a and the carrier supplying layer 405b are epitaxially grown as one by one on the substrate 401, with a growth temperature as 1,050° C. Moreover, as a doping source of p type corresponding to the carrier drifting layer 405a, $Cp_2Mg$ is used, and then a rate of flow for $Cp_2Mg$ is controlled for a concentration of the Mg therein to be approximately $1 \times 10^{17}$ cm$^{-3}$. Further, the $SiH_4$ is used as a doping source of n type corresponding to the drift layer 404 and to the carrier supplying layer 405b. And then a flow rate of $SiH_4$ is controlled for a concentration of the Si to be approximately $5 \times 10^{16}$ cm$^{-3}$ in the drift layer 404 and to be approximately $5 \times 10^{18}$ cm$^{-3}$ in the carrier supplying layer 405b respectively. Furthermore, each of the thicknesses regarding the drift layer 404, the carrier drifting layer 405a and the carrier supplying layer 405b is designed to be as 10 μm, 500 nm and 100 nm, respectively.

Next, as shown in FIG. 9A, by using the PCVD method, an a-Si layer is formed with a thickness as 500 nm on the carrier supplying layer 405b. Moreover, a process of a patterning is performed by using the photolithography and with using the $CF_4$ gas, and then a mask layer 410 is formed at a region for a part on the carrier supplying layer 405b.

Next, the carrier drifting layer 405a and the carrier supplying layer 405b are etched and removed to a depth as reaching the drift layer 404, with using the mask layer 410 as a mask, and using the $Cl_2$ gas therewith. In this case, a side wall of the mask layer 410 is etched as well, as similar to the first and the second embodiments. As a result, as shown in FIG. 9B, the surface 404a of the drift layer 404 becomes to be exposed, and then for the semiconductor operating layer 405, the side wall 405d inclines at the angle θ5 from the surface 404a.

Next, as shown in FIG. 9C, the mask layer 410 is removed, and then the gate insulating layer 408 comprised of $SiO_2$ is formed with a thickness of 60 nm over the top surface of the semiconductor operating layer 405, the inclined side wall 405d and the top surface 404a of the drift layer 404 by using the PCVD method. Here, because the side wall 405d is inclined, it becomes able to form the gate insulating layer 408 with further uniformness in thickness.

Next, as shown in FIG. 9D, a part of the gate insulating layer 408 is removed by using the hydrofluoric acid, and then a part of the carrier supplying layer 405b is removed as well. Moreover, the source electrode 406 is formed by using the lift-off technology, and the drain electrode 407 is formed over a rear surface of the substrate 401 as well. Here, the source electrode 406 and the drain electrode 407 are designed to be as the Ti/Al structure with a thickness 25/300 nm each. Further, it is possible to perform a layer formation for the metal layer by using the spattering method, the vacuum evaporation method, or the like. Still further, after forming the source electrode 406 and the drain electrode 407, a process of the annealing is performed for ten minutes at a temperature of 600° C. approximately. Furthermore, by using the lift-off technology, the gate electrode 409 is formed with having a Ti/Au/Ti structure for surrounding the side wall 405d, and then the MOSFET 400 is completed as shown in FIG. 8.

As described above, the MOSFET 400 according to the fourth embodiment becomes to be the MOSFET of the vertical type having the property of the breakdown voltage as higher.

Example 3

Comparative Example 3

As Example 3-1, 3-2 and Comparative example 3 according to the present invention, each of MOSFETs is produced, that individually has a structure as similar to that of the MOSFET 400 as shown in FIG. 8. Here, regarding the MOSFET according to Example 3-1 is produced by following the above described process. Moreover, regarding the MOSFET according to Example 3-2, a mask layer is formed, which is comprised of a resist resin of the positive type as similar to that according to Example 1-2, and then a patterning for a recess is performed therewith. Further, regarding the MOSFET according to Comparative example 3, the difference is that a mask layer is formed, which is comprised of $SiO_2$ as similar to that according to Comparative example 1, and then a patterning for a recess is performed therewith. Still further, an on-resistance and a breakdown voltage are measured for each of the MOSFETs according to Example 3-1, 3-2 and Comparative example 3 respectively. Furthermore, each of angles at which each of the side walls is extending regarding each of inclining formation layers is measured, respectively.

FIG. 10 is a chart showing an angle at a side wall, an on-resistance and a breakdown voltage for each of the MOSFETs according to Example 3-1, 3-2 and Comparative example 3 respectively. As shown in FIG. 10, in the case of Comparative example 3, the on-resistance is as high as 16 mΩ cm$^2$, and the breakdown voltage is as low as 200 V. On the contrary, in the case of Example 3-1 and 3-2, each of the on-resistances is lower at 5 mΩ cm$^2$ and 9 mΩ cm$^2$, respectively. Moreover, each of the breakdown voltages is higher at 530 V and 550 V, respectively, that are the values as approximately similar to the value of the breakdown voltage as 600 V, which is estimated with using the thickness of the drift layer. That is to say, it becomes able to confirm that there becomes no localized convergence of the electric field occurring at between the gate and the drain regarding the MOSFETs according to Example 3-1 and 3-2.

Here, according to the above described first and the second embodiment, regarding the side wall of the semiconductor operating layer, the angle relative to the surface of the lower semiconductor layer is similar in both directions. However, an angle may be different between, for example, a part at a carrier drifting layer and a part at a carrier supplying layer. Moreover, it may be not a straight shape but may be curved as well. The same applies to the carrier drifting layer and the carrier supplying layer according to the third embodiment. Furthermore, according to the above described third embodiment, the MOSFET is the n type in which the carrier is an electron, however, the present invention is not limited thereto, and it is possible to apply to an MOSFET of p type as well.

Although the invention has been described with respect to specific embodiments for a complete and clear disclosure, appended claims are not to be thus limited but are to be construed as embodying all modifications and alternative constructions that may occur to one skilled in the art that fairly fall within the basic teaching herein set forth.

What is claimed is:

1. A field effect transistor, comprising:
a substrate;
a lower semiconductor layer of nitride-based compound semiconductor formed on the substrate;
a semiconductor operating layer of nitride-based compound semiconductor formed on the lower semiconductor layer and having a recess, the semiconductor operating layer comprising a carrier drifting layer formed on the lower semiconductor layer and a carrier supplying layer formed on the carrier drifting layer, the carrier supplying layer having a band gap energy greater than that of the carrier drifting layer;
an insulating layer formed on the semiconductor operating layer and contacting the lower semiconductor layer at a bottom of the recess;
a gate electrode formed on the insulating layer at the recess; and
a source electrode and a drain electrode formed on the same surface of the semiconductor operating layer and electrically connected to the semiconductor operating layer with the recess in between the source electrode and the drain electrode, wherein
a side wall of the recess at a side of the drain electrode ascends at an angle of θ1 from a top surface of the lower semiconductor layer,
a side wall of the recess at a side of the source electrode ascends vertically or at an angle of θ2 from the top surface of the lower semiconductor layer, and
the angle θ1 is different from the angle θ2.

2. The field effect transistor according to claim 1, wherein
the lower semiconductor layer has a p type electrical conductivity, and
the carrier drifting layer has an n type electrical conductivity.

3. The field effect transistor according to claim 2, wherein
the side wall of the recess at the side of the source electrode ascends at the angle θ2 from the top surface of the lower semiconductor layer, and
each of the angles θ1 and θ2 is smaller than 65 degrees.

4. The field effect transistor according to claim 2, wherein
the recess extends into a partial thickness of the lower semiconductor layer, and
the insulating layer contacts the lower semiconductor layer not only at the bottom of the recess but also at the side walls.

5. The field effect transistor according to claim 2, wherein the side walls of the recess in the semiconductor operating layer are curved.

6. The field effect transistor according to claim 2, further comprising a pair of contact regions contacting with the source electrode and the drain electrode, respectively, wherein
the contact regions have a conductivity higher than that of the semiconductor operating layer, and
each of the contact regions extends, in a thickness direction of the substrate, from the respective source or drain electrode to the lower semiconductor layer.

7. The field effect transistor according to claim 2, further comprising a pair of contact regions contacting with the source electrode and the drain electrode, respectively, wherein
the contact regions have a conductivity higher than that of the semiconductor operating layer, and
each of the contact regions extends, in a thickness direction of the substrate, from the respective source or drain electrode into a partial thickness of the lower semiconductor layer.

8. The field effect transistor according to claim 2, wherein
the lower semiconductor layer is a p type GaN, and
the carrier drifting layer is an n-type GaN.

9. The field effect transistor according to claim 1, wherein
the lower semiconductor layer has a p-type electrical conductivity,
the carrier drifting layer is a un-doped semiconductor layer,
the carrier supplying layer has an n− type electrical conductivity
the semiconductor operating layer further includes a pair of contact regions respectively contacting with the source electrode and the drain electrode, and
the contact regions have an n+ type electrical conductivity.

10. The field effect transistor according to claim 1, wherein
the side wall of the recess at the side of the source electrode ascends at the angle θ2 from the top surface of the lower semiconductor layer, and
each of the angles θ1 and θ2 is smaller than 65 degrees.

11. The field effect transistor according to claim 2, wherein an entirety of the insulating layer is above the top surface of the lower semiconductor layer.

12. The field effect transistor according to claim 2, wherein the recess exposes the top surface of the lower semiconductor layer and the semiconductor operating layer is on the exposed top surface.

13. The field effect transistor according to claim 2, wherein a bottom surface of the semiconductor operating layer is coplanar with the bottom surface of the insulating layer.

14. The field effect transistor according to claim 1, wherein an entirety of the insulating layer is above the top surface of the lower semiconductor layer.

15. The field effect transistor according to claim 1, wherein the recess exposes the top surface of the lower semiconductor layer and the operating layer is on the exposed top surface.

16. The field effect transistor according to claim 1, wherein a bottom surface of the operating layer is coplanar with the bottom surface of the insulating layer.

17. The field effect transistor according to claim 2, wherein
the side wall of the recess at the side of the source electrode ascends at the angle θ2 from the top surface of the lower semiconductor layer, and
each of the angles θ1 and θ2 is greater than 45 degrees and smaller than 75 degrees.

18. The field effect transistor according to claim 2, wherein the side wall of the recess at the side of the source electrode ascends vertically from the top surface of the lower semiconductor layer.

19. The field effect transistor according to claim 1, wherein
the side wall of the recess at the side of the source electrode ascends at the angle θ2 from the top surface of the lower semiconductor layer, and
each of the angles θ1 and θ2 is greater than 45 degrees and smaller than 75 degrees.

20. The field effect transistor according to claim 1, wherein the side wall of the recess at the side of the source electrode ascends vertically from the top surface of the lower semiconductor layer.

* * * * *